United States Patent [19]

Nojima et al.

[11] Patent Number: 4,772,856
[45] Date of Patent: Sep. 20, 1988

[54] POWER AMPLIFIER

[75] Inventors: Toshio Nojima, Yokosuka; Sadayuki Nishiki, Yokohama, both of Japan

[73] Assignee: Nippon Telegraph and Telephone Corporation, Tokyo, Japan

[21] Appl. No.: 72,207

[22] Filed: Jul. 10, 1987

[30] Foreign Application Priority Data

Jul. 30, 1986 [JP] Japan ................................. 61-177796

[51] Int. Cl.⁴ ........................................... H03F 3/217
[52] U.S. Cl. ..................................... 330/251; 328/23; 330/277; 330/295; 330/306
[58] Field of Search ............... 330/207 A, 251, 124 R, 330/277, 295, 306; 328/23

[56] References Cited
PUBLICATIONS

Lohrmann, "Amplifier Has 85% Efficiency", *Electronic Design*, Mar. 1966, pp. 38–43.

*Primary Examiner*—James B. Mullins
*Attorney, Agent, or Firm*—Pollock, Vande Sande and Priddy

[57] ABSTRACT

An input signal is divided equally by a divider and the equally divided outputs are applied to first and second amplifying means, respectively. A filter means, which rejects the fundamental wave component of the input signal but passes therethrough its harmonic component, is connected between the first and second amplifying means. The outputs of the first and second amplifying means are respectively connected to first and second select circuits which select the fundamental wave components of the input signal. The outputs from the first and second circuits are combined in phase with each other, by a combiner, into a composite signal.

12 Claims, 6 Drawing Sheets

POWER AMPLIFIER

BACKGROUND OF THE INVENTION

The present invention relates to a power amplifier which is suitable for use in nonlinear amplification in high-frequency bands.

Conventionally known as this kind of power amplifier is a class "F" amplifier (Tayler, V. J., "A New High Efficiency High Power Amplifier", Marconi Review, vol. 21, No. 130, pp. 96-109, 3rd Quarter, 1958, for example). The class "F" amplifier has such an arrangement as shown in FIG. 1, in which an input signal from an input terminal 11 is applied to the gate of an FET 12 serving as an amplifying element and the FET 12 has its source grounded and its drain connected to a power source terminal 14 via a choke coil 13 which blocks high frequencies. The drain of the FET 12 is grounded via a filter 15 which permits the passage therethrough of a second harmonic component of the input signal and at the same time it is connected to an output terminal 18 via a filter 16 which permits the passage therethrough of the fundamental wave component of the input signal and via an impedance matching circuit 17.

The FET 12 is supplied with a class "A" or "AB" bias and generates harmonics of the input signal fed from the input terminal 11. The filter 15 acts as a short-circuit load for a second harmonic component and as an open-circuit load for a third harmonic (an odd order harmonic) component. As a result of this, a current i(t), which is a superimposition of the fundamental and second harmonic components of the input signal, flows as indicated by the solid line in FIG. 2A, and a voltage v(t), which is a superimposition of the fundamental and third harmonic components of the input signal, is created 180 degrees out of phase with the current i(t) as indicated by the broken line in FIG. 2A. The amplifying operation of the FET 12 is close to a switching operation. An overlap of the waveforms of the current i(t) and the voltage v(t) in FIG. 2A is a loss which is dissipated by the FET 12. In this instance, since the current i(t) and the voltage v(t) are 180 degrees out of phase with each other as mentioned above, the loss is small, and accordingly a high efficiency can be achieved in the amplifying operation. It is known in the art that the closer to the half wave of a sine wave the waveform of the current i(t) is and the closer to a square wave the waveform of the voltage v(t) is while the less these waveforms overlap, the more the efficiency is increased.

However, since the class "F" amplifier has at its output a short-circuit load for the second harmonic component, an increase in the gain of the FET 12 will cause the second harmonic components of internal electronic disturbance in the gate of the FET 12 to produce a large short-circuit current through the filter 15. In practice, the filter 15 has a certain passing band width, and hence will allow a larger current flow therethrough caused not only by the second harmonic component but also by an electronic disturbance (noise) of frequencies close to that of the former; therefore, the class "F" amplifier lacks stability in operation.

Where the class "F" amplifier is employed in a high-frequency band such as the microwave band, the filters 15 and 16 are each formed by a strip line as shown in FIG. 3, and the length of the filter 15 is specifically selected to be a quarter of the wavelength of the fundamental wave of the input signal. The filter 15 is grounded via a DC blocking condenser 21 and the filter 15 is connected to the output terminal 18 via a DC blocking condenser 22. Accordingly, the filter 15 functions, when seen from the drain terminal of the FET 12, as an open-circuit load for the fundamental wave and as a short-circuit load for the second harmonic. In practice, however, it has been difficult, even through utilization of such strip line filters, to obtain a class "F" amplifier suitable for operation at frequencies above 1 GHz or so, because the lengths of the strip lines must become unpractically short. Moreover, since the filter 15 has to be grounded at one end through a through-hole to a grounding conductor formed on the opposite surface of a circuit board, complicated and high precision manufacturing techniques are required for obtaining the intended filter characteristic. Also for this reason, the class "F" amplifier is not suitable for use especially in high-frequency bands.

SUMMARY OF THE INVENTION

It is therefore an object of the present invention to provide a power amplifier which is high in efficiency and stable in operation.

Another object of the present invention is to provide a power amplifier which is high in efficiency, stable in operation, and relatively easy to manufacture for use in particularly high-frequency bands.

According to the present invention, the input signal is divided by a divider into two, and the divider outputs are applied to first and second amplifying means for creating their individual harmonics. A filter means is connected across the outputs of the first and second amplifying means. The filter means includes a filter that rejects the fundamental frequency component but passes therethrough the harmonic components of the input signal. The outputs of the first and second amplifying means are respectively connected to first and second select circuits which pass the fundamental frequency component of the input signal. The outputs from the first and second select circuits are combined at the same amplitude and in phase with each other.

The power amplifier according to the invention also includes phase inversion means which causes an even order harmonic component in the output of either one of the first and second amplifying means to be 180 degrees out of phase with respect to an even order harmonic component fed thereto from the other one of the amplifying means via the filter means so as to cancel each other. In other words, the load viewed from the output side of each of the first and second amplifying means constitutes a short-circuit load for the even order harmonic component; in this respect, an operation characteristic similar to that of the afore-mentioned class "F" amplifier is performed. The filter means may include a filter by which an odd order harmonic component from the output of either one of the first and second amplifying means and an odd order harmonic component from the output of the other amplifying means via the filter, are rendered equal in phase with each other at the output side of either of the first and second amplifying means. In this case, the load viewed from the output side of each of the first and second amplifying means constitutes an open-circuit load for the odd order harmonic component and the amplifying operation characteristic becomes further closer to that of the class "F" amplifier.

In addition, since the internal random disturbances of the two amplifying means are independent of each other, the filter means will not function as short-circuit loads for the even order harmonic components of the random disturbances. That is, there is no fear of the amplifying operation becoming instable. Furthermore, since the filter means is connected across the outputs of the first and second amplifying means, it is possible to employ, if desired, an arrangement of the filter means that requires no through-hole in a circuit board for connection to ground, and accordingly a power amplifier for use at particularly high frequencies can be fabricated relatively easily.

DESCRIPTION OF THE PREFERRED EMBODIMENTS

Figure 4:
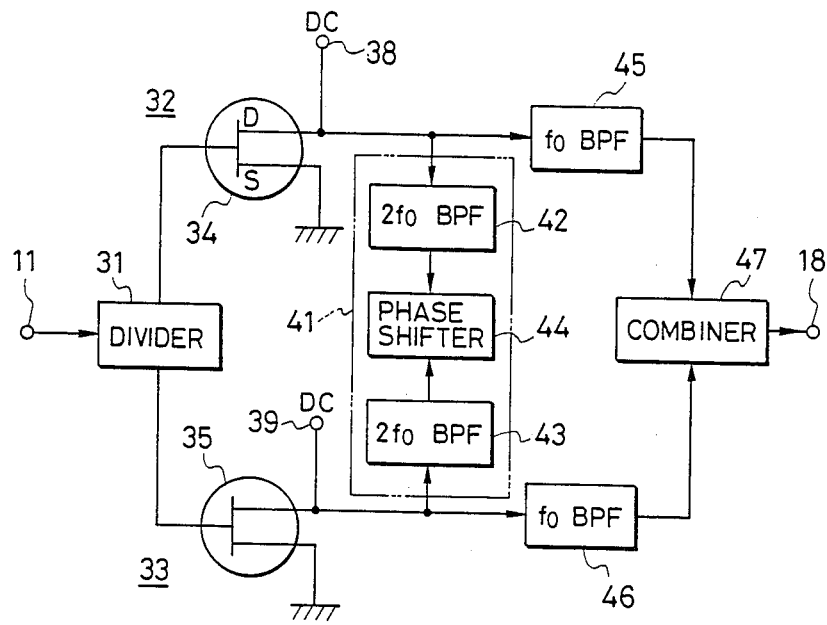
FIG. 4 is a block diagram illustrating an example of the power amplifier of the present invention which employs, as a filter means, a band pass filter which passes therethrough the second harmonic component.

Referring now to FIG. 4, a concrete embodiment of the present invention will be described. An input signal from the input terminal 11 is equally divided by a divider 31, for which may be used a 90° hybrid, in-phase hybrid, or opposite-phase hybrid. The divider 31 has its two output terminals connected to the inputs of first and second amplifying means 32 and 33, respectively. The first and second amplifying means 32 and 33 employ, for example, FETs 34 and 35 as amplifying elements. The FETs 34 and 35 have their gates connected to the two output terminals of the divider 31, respectively, their sources grounded, and their drains connected to DC power terminals 38 and 39, respectively. In order for the first and second amplifying means 32 and 33 to produce a lot of harmonic components, the FETs 34 and 35 are each supplied at the gate with a class "B" bias.

The outputs of the first and second amplifying means 32 and 33, i.e. the drains of the FETs 34 and 35 in this example, are interconnected via a filter means 41. In this example, band pass filters 42 and 43 which inhibit the passage therethrough of the fundamental frequency component $f_0$ of the input signal but permit the passage therethrough of its second harmonic component $2f_0$, are connected, as the filter means 41, to the drains of the FETs 34 and 35. The outputs of the band pass filters 42 and 43 are interconnected via a phase shifter 44. A variable delay line or variable phase shifter, for instance, is used as the phase shifter 44.

The drains of the FETs 34 and 35 are also connected to band pass filters 45 and 46 which serve as first and second select circuits which pass the fundamental frequency component $f_0$ of the input signal. The outputs of the band pass filters 45 and 46 are connected to two input terminals of an in-phase combiner 47, which has its output terminal connected to the signal output terminal 18. The combiner 47 needs only to combine two inputs in phase with each other and may be formed by a device which corresponds to a device used as the divider 31, such as a 90° hybrid, in-phase hybrid, or opposite-phase hybrid.

The band pass filters 42 and 45 and the drain of the FET 34 are impedance-matched and the band pass filters 43 and 46 and the drain of the FET 35 are also impedance-matched. A current $i_1$ of the second harmonic component $2f_0$ flows from the drain of the FET 34 via the filter means 41 to the drain of the FET 35. Conversely, a current $i_2$ of the second harmonic component $2f_0$ flows from the drain of the FET 35 via the filter means 41 to the drain of the FET 34. At this time, the voltage of the second harmonic component $2f_0$ flowing from the drain of the FET 34 to the band pass filter 42 and the voltage of the second harmonic component $2f_0$ flowing from the band pass filter 42 to the drain of the FET 35 are rendered 180 degrees out of phase with each other at the drain of the FET 34. Similarly, voltages of the second harmonic component $2f_0$ from the drain of the FET 35 to the band pass filter 43 and from the latter to the former are also rendered opposite in phase to each other at the drain of the FET 35. The phase shifter 44 is regulated accordingly. The FETs 34 and 35 are formed by those of the same characteristic. The above mentioned phase inversion capability for the second harmonic components can be provided to either the band pass filters 42, 43 or the phase shifter 44 of the filter means 41. In the case where a 90° hybrid is employed as the divider 31, the filter means 41 may not have phase inversion capability because the second harmonic components produced by the FETs 34 and 35 are opposite in phase, providing that the signal paths from the outputs of the divider 31 to the gates of the FETs 34 and 35 produce the same amount of phase shift.

Figure 1:
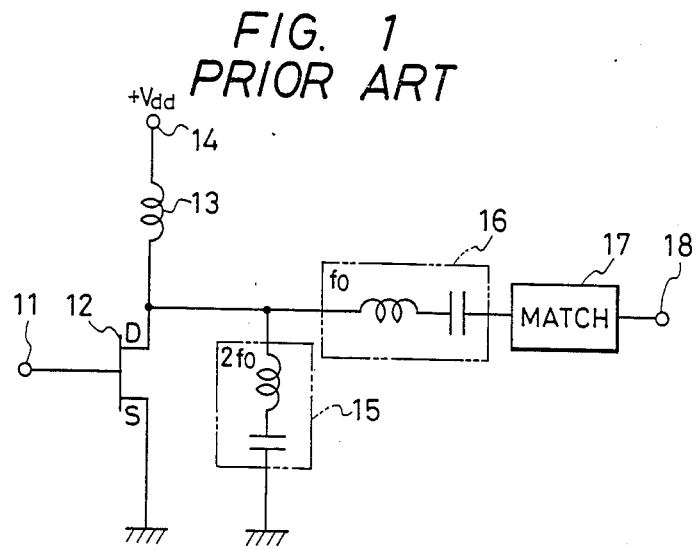
FIG. 1 is a connection diagram showing a conventional class "F" amplifier.
Figure 2A:
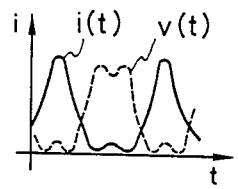
FIG. 2A is a diagram showing the waveforms of the current and voltage at the drain of an FET used in the amplifier depicted in FIG. 1.
Figure 2B:
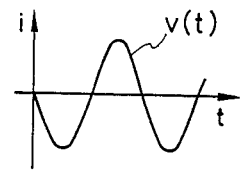
FIG. 2B is a diagram showing the output waveform of the power amplifier of the present invention.
Figure 3:
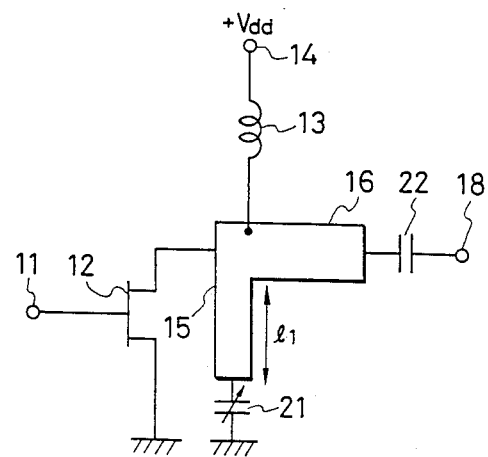
FIG. 3 is a connection diagram illustrating the conventional class "F" amplifier adapted for operation in a very high frequency band.

With such an arrangement, the input signal from the input terminal 11 is divided by the divider 31 into two outputs, which are applied to the first and second amplifying means 32 and 33 for creating harmonic components. The second harmonic component $2f_0$ output from the drain of each of the FETs 34 and 35 is provided via the filter means 41 to the drain of the other FET without substantial loss. These harmonic components are equal in amplitude but opposite in phase, and hence are short-circuited. Third harmonic components $3f_0$ occurring in the drains of the FETs 34 and 35 are rejected by the band pass filters 42, 43, 45 and 46, and hence are open-circuited. On the other hand, only the fundamental harmonic components $f_0$ of the output signal are rejected by the band pass filters 42 and 43 but permitted to pass through the band pass filters 45 and 46 and are then combined by the combiner 47 in phase with each other, and the combined output is provided at the output terminal 18. That is, the power amplifier of this embodiment has the same operation characteristics as does the conventional class "F" amplifier. In the drain of each of the FETs 34 and 35, the current i(t) which is a superimposition of the fundamental and second harmonic components $f_0$ and $2f_0$ on each other flows as indicated by the solid line in FIG. 2A, that is, just like a half wave of a sine wave, and the voltage v(t) which is a superimposition of the fundamental and third harmonic components $f_0$ and $3f_0$ on each other is produced as indicated by the broken line in FIG. 2A, that is, just like a square wave. The input signal is amplified by the FETs 34 and 35 in a switching mode, thereby performing power amplification with a high efficiency. The amplifier output voltage available at the output terminal 18 is only the fundamental harmonic component as shown in FIG. 2B.

Figure 5:
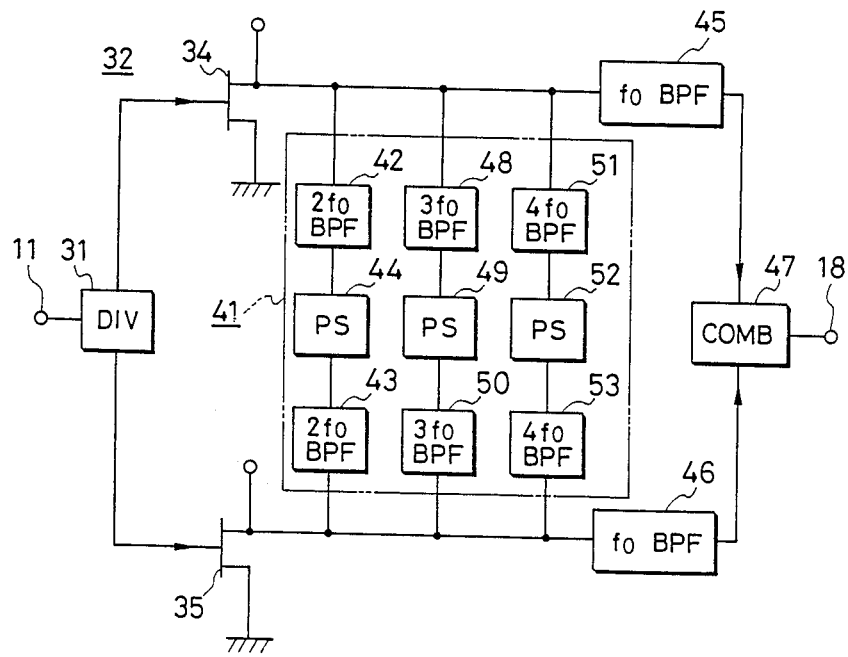
FIG. 5 is a block diagram illustrating the power amplifier of the present invention which employs a filter means adapted to pass therethrough each harmonic component.

The filter means 41 can also be adapted to effectively act on each harmonic component. As illustrated in FIG. 5 in which the parts corresponding to those in FIG. 4 are identified by the same reference numerals, a band pass filter 48 which passes therethrough the third harmonic component $3f_0$ of the input signal, a phase shifter 49, and a band pass filter 50 which passes therethrough the third harmonic component $3f_0$ are connected between the drains of the FETs 34 and 35, in addition to the provision of the band pass filters 42 and 43 and the phase shifter 44 for the second harmonic component $2f_0$. The phase shifter 49 is regulated so that voltages of the third harmonic component $3f_0$ which flow in and out of the band pass filters 48 and 50 in opposite directions are of the same amplitude and phase in each of the drains of the FETs 34 and 35.

Furthermore, a band pass filter 51 which passes therethrough a fourth harmonic component $4f_0$ of the input signal, a phase shifter 52, and a band pass filter 53 which passes therethrough the fourth harmonic component $4f_0$ are connected between the drains of the FETs 34 and 35. The phase shifter 52 is regulated so that voltages of the fourth harmonic component $4f_0$ which flow into and out of the band pass filters 51 and 53 in opposite directions are of the same amplitude but opposite in phase in each of the drains of the FETs 34 and 35.

In short, the filter means 41 has an arrangement in which it rejects the fundamental frequency component $f_0$ of the input signal but passes therethrough its higher harmonic components and constitutes a short-circuit load for even order harmonics $2f_0$, $4f_0$, ... and an open-circuit load for odd order harmonics $3f_0$, $5f_0$, ..., respectively.

Figure 6:
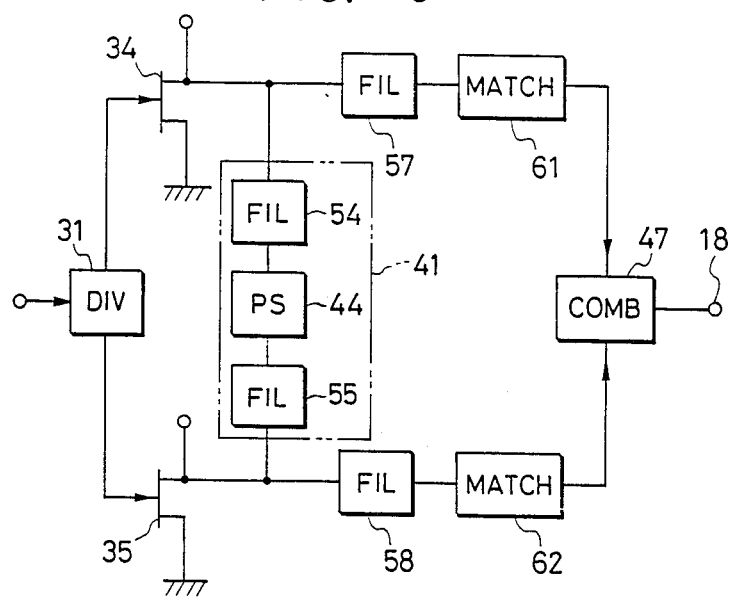
FIG. 6 is a block diagram illustrating the power amplifier of the present invention, for explaining modified forms of the filter means and a select circuit.

In the above examples of the invention band pass filters are employed as the filter means 41, but other kinds of filters can also be utilized. For example, as shown in FIG. 6, a filter 54, a phase shifter 44, and a filter 55 are connected across the drains of the FETs 34 and 35; in this instance, band rejection filters which reject the fundamental frequency component $f_0$, or high pass filters which have a cutoff frequency intermediate between $f_0$ and $2f_0$, may also be employed as the filters 54 and 55. Likewise, the select circuits which select the fundamental harmonic components $f_0$ for input into the combiner 47 need not be limited specifically to the band pass filters 45 and 46, but they may also be formed by band rejection filters which reject the second harmonic component $2f_0$, or low pass filters which have a cutoff frequency intermediate between $f_0$ and $2f_0$, as indicated by 57 and 58 in FIG. 6. In either case, it is possible to insert between the select circuits 57 and 58 and the combiner 47 matching circuits 61 and 62 for matching the fundamental harmonic component $f_0$ with the FETs 34 and 35.

Figure 7A:
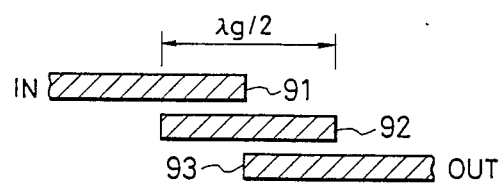
FIG. 7A is a diagram showing a specific operative example of a band pass filter for use in the present invention.
Figure 7B:
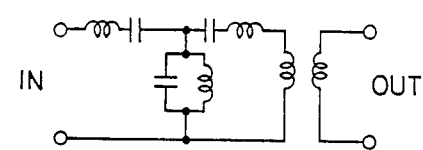
FIG. 7B is its equivalent circuit diagram.

The filters 54 and 55 can be formed relatively easily as RF filters. In the case of forming each of them as a band pass filter, distribution-coupled strip lines 91, 92 and 93 are connected in a staggered, partly overlapping relation and the length of the distribution-coupled strip line 92 is chosen to be $\lambda g/2$ (where $\lambda g$ is the working wavelength on the line) as shown in FIG. 7A. With this arrangement, a component of a frequency $vg/\lambda g$ (where vg is the velocity of signal propagation) is outputted from the line 93 in response to an input to the line 91. FIG. 7B shows an equivalent circuit of such a band pass filter.

Figure 8A:
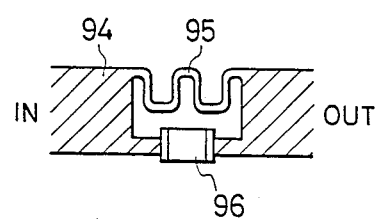
FIG. 8A is a diagram showing a specific operative example of a band rejection filter for use in the present invention.
Figure 8B:
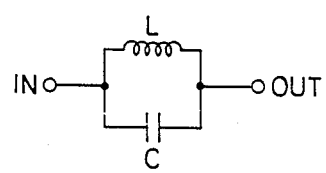
FIG. 8B is its equivalent circuit diagram.

In the case of forming each of the filters 54 and 55 as a band rejection filter, it is necessary only to insert, in parallel, a strip line inductor 95 and a strip line chip capacitor 96 in a strip line 94 as depicted in FIG. 8A. Letting the inductance of the inductor 95 and the capacitance of the capacitor 96 be represented by L and C, respectively, the rejection frequency is around $1/\sqrt{LC}$. FIG. 8B shows an equivalent circuit of this band rejection filter.

Figure 9A:
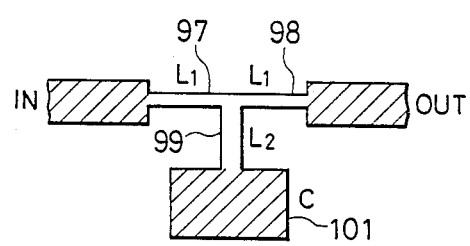
FIG. 9A is a diagram showing a specific operative example of a low pass filter for use in the present invention.
Figure 9B:
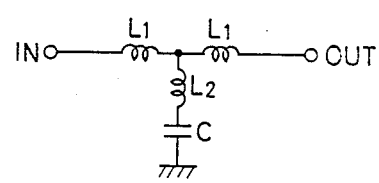
FIG. 9B is its equivalent circuit diagram.

The filters 57 and 58 can also each be formed as a low pass filter, simply by connecting strip line inductors 97, 98 and 99 in a T-letter shape between input and output side strip lines and connecting a strip line capacitor 101 to the foot end of the T-shaped connection as depicted in FIG. 9A. FIG. 9B shows an equivalent circuit of this low pass filter.

Figure 10A:
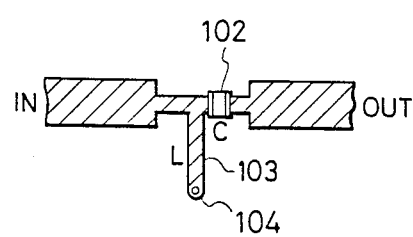
FIG. 10A is a diagram showing a specific operative example of a high pass filter for use in the present invention.
Figure 10B:
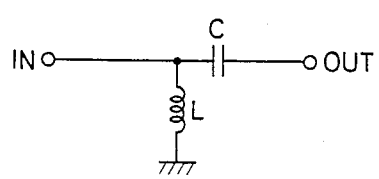
FIG. 10B is its equivalent circuit diagram.

Moreover, the filters 57 and 58 can each be formed as a high pass filter, by connecting a chip capacitor 102 between input and output side strip lines and connecting a strip line inductor 103 at one end to the connection point and at the other end to a grounding conductor line on the opposite surface of the circuit board (not shown) through a through-hole 104 as illustrated in FIG. 10A. FIG. 10B shows an equivalent circuit of this high pass filter.

Figure 11:
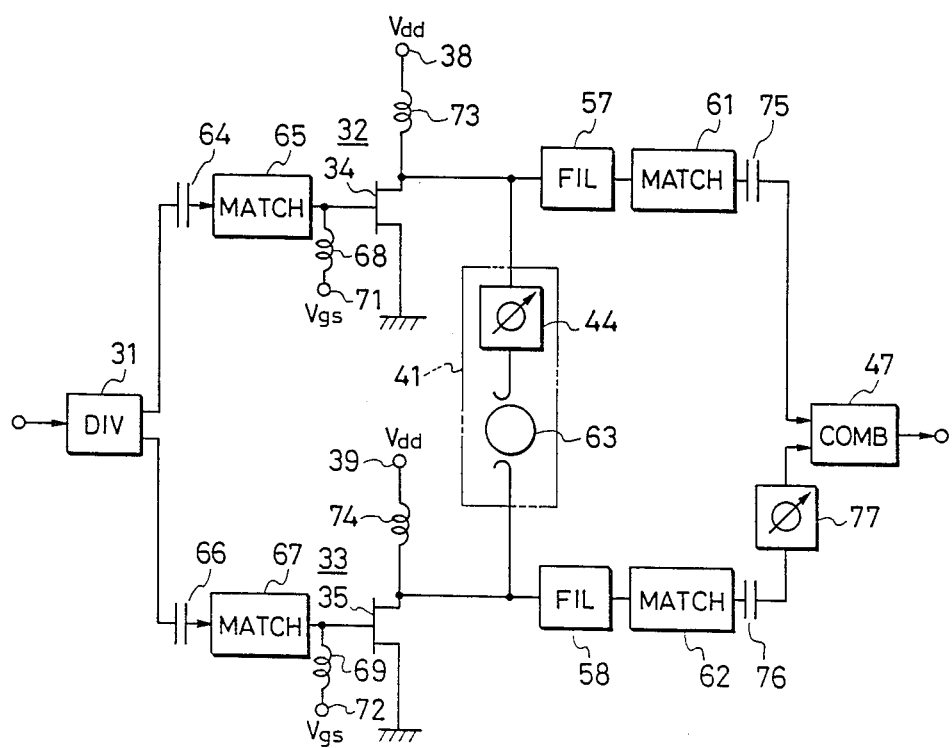
FIG. 11 is a connection diagram illustrating another example of the power amplifier of the present invention which employs, as the filter means, a resonance circuit for the second harmonic component.

A dielectric resonator, for example, can be employed as the band pass filter which passes therethrough the second harmonic component $2f_0$. For instance, as shown in FIG. 11, the drain of the FET 34 is coupled via the phase shifter 44 to a dielectric resonator 63 which resonates to at the frequency $2f_0$, and the drain of the FET 35 is coupled directly to the dielectric resonator 63. Dielectric resonators are commercially available which can be actually employed at 1 to 40 GHz at present. Accordingly, the power amplifier of the present invention can easily be designed for high-frequency operations. Since the band pass filter composed of a dielectric resonator has a relatively high Q, the insertion loss of the band pass filter can be made relatively low and therefore the short-circuiting effect for the second harmonic component $2f_0$ will be improved.

FIG. 11 illustrates a more practical embodiment of the power amplifier of the present invention. A DC blocking condenser 64 and an input matching circuit 65 are connected between one output terminal of the divider 31 and the gate of the FET 34, and a DC blocking condenser 66 and an input matching circuit 67 are connected between the other output terminal of the divider 31 and the gate of the FET 35. The gates of the FETs 34 and 35 are connected via high frequency blocking choke coils 68 and 69 to gate bias source terminals 71 and 72, respectively. Connected between the drains of the FETs 34 and 35 and the DC power sources 38 and 39, respectively, are high frequency blocking choke coils 73 and 74. A DC blocking condenser 75 is connected between the matching circuit 61 and one input terminal of the combiner 47, and a DC blocking condenser 76 and a phase shifter 75 are connected between the matching circuit 62 and the other in put terminal of the combiner 47.

While in the above the first and second amplifying means 32 and 33 are each described as including one amplifying elements, it is also possible to employ a parallel connection of a plurality of amplifying elements, for instance, FETs. The amplifying elements are not limited specifically to the FETs but may also be bipolar transistors or similar elements. In the embodiments of FIGS. 4, 5 and 6 the filters 42, 43, 48, 50, 51, 53, 54, 55 are provided in pairs for the respective harmonic components to achieve symmetric signal paths on a circuit board. This arrangement is effective to facilitate phase-adjustment at the phase shifter 44 when the power amplifier is designed for relatively high frequency operation; however, one of the filters in each pair may be omitted as shown in the embodiment of FIG. 11. It should be noted that when the signal path between the drains of FETs 34 and 35 via the filter means 41 is contemplated to effect phase-inversion for the second order harmonic components, either the phase shifter 44 or the combination of the filters 42 and 43 (or 54 and 55) may be designed to have the phase-inversion capability. In either case, the phase shifter is desired to be phase-adjustable. It should also be noted that when the power amplifier is designed to operate at particularily high frequency, the length of a signal path strongly affects the phase characteristics of the signal path and, therefore, it is important that the total phase shift by the signal path including the filter means 41 be adjusted such that at the drain of either one of the FETs 34 and 35, the phase of the second harmonic component emerging therefrom is 180° out of phase with respect to the phase of the entering second harmonic component from the drain of the other one of the FETs via the filter means 41. Once the length of the signal path s suitably adjusted to satisfy the above requirement, the phase shifter 44 can be dispensed with. In a similar manner, the phase shifters 49 and 52 in FIG. 5 can be dispensed with.

Figure 12:
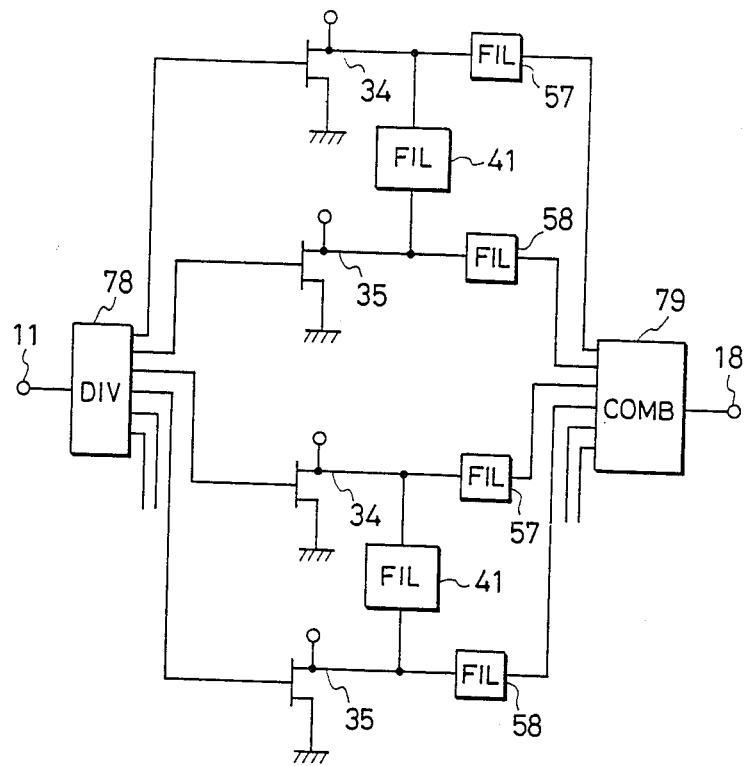
FIG. 12 is a block diagram illustrating an example in which a plurality of power amplifiers of the present invention are connected in parallel.
Figure 13:
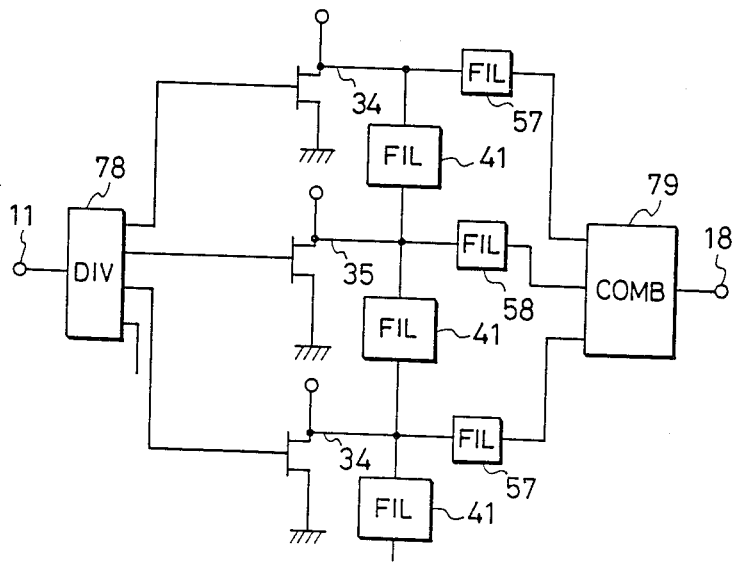
FIG. 13 is a block diagram illustrating another example in which a plurality of power amplifiers of the present invention are connected in parallel.

A high voltage output can be obtained by connecting in parallel a plurality of the power amplifiers described above. For example, as shown in FIG. 12, the input signal from the input terminal 11 is divided into four or more even number equal signals, which are provided in pairs to the FETs 34 and 35 of respective pairs. The filter 41 and the select filter circuits 57 and 58 are provided for each pair of FETs 34 and 35, and the outputs from the respective select filter circuits 57 and 58 are combined by the combiner 79 in phase with one another. In this instance, the filter 41 may also be connected between adjacent amplifying means as shown in FIG. 13. It is also possible to connect another filter means between the first and last stages of the arrangement of the amplifying means in FIG. 13.

According to the power amplifier of the present invention described above, disturbances which occur in the first and second amplifying means 32 and 33 are random and second harmonic components $2f_0$ (even order harmonic components, in general) of the same magnitude will not be created in the first and second amplifying means 32 and 33 at the same time; therefore the power amplifier is not likely to become unstable but operates stably.

It is possible to employ an arrangement in which the filter means 41 needs only to be connected between the output sides of the first and second amplifying means and need not be grounded. Therefore, an amplifier for use at high frequencies as in the microwave band can be fabricated relatively easily because no circuit board through-hole is required.

Figure 14:
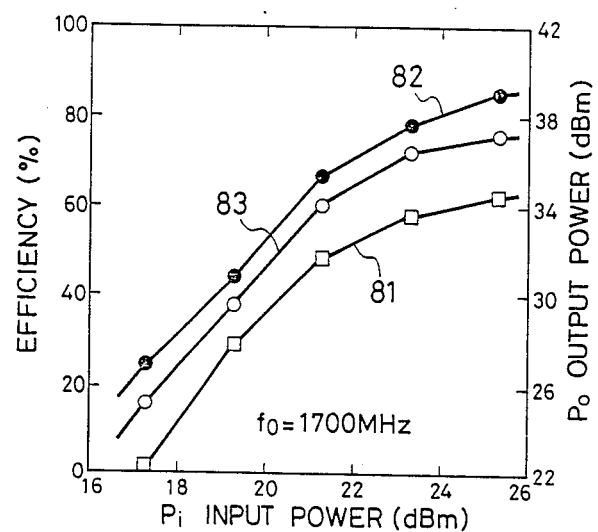
FIG. 14 is a graph showing input power vs. output power and efficiency characteristics of the power amplifier of the present invention.

The power amplifier of the present invention operates in a manner similar to the class "F" amplifier, as referred to previously, and hence it will achieve a high efficiency. For example, in a 1700 MHz band, according to the power amplifier of the present invention, its output power Po with respect to its input power Pi is as indicated by curve 81 in FIG. 14, the drain efficiency, $\eta_d = P_o/P_{DC} \times 100(\%)$ (where $P_{DC}$ is DC power consumption by the FET 34) is as indicated by curve 82, and the power added efficiency, $\eta_{ad} = (P_o - P_i)/P_{DC} \times 100(\%)$, is as indicated by curve 83. As the input power Pi increases, the harmonic components of the output power increase, and the efficiencies $\eta_d$ and $\eta_{ad}$ also increase correspondingly. For instance, when the input power Pi is about 25 dB, the efficiency $\eta_d$ is as high as 80% and the efficiency $\eta_{ad}$ is as high as 70% or so.

Figure 15:
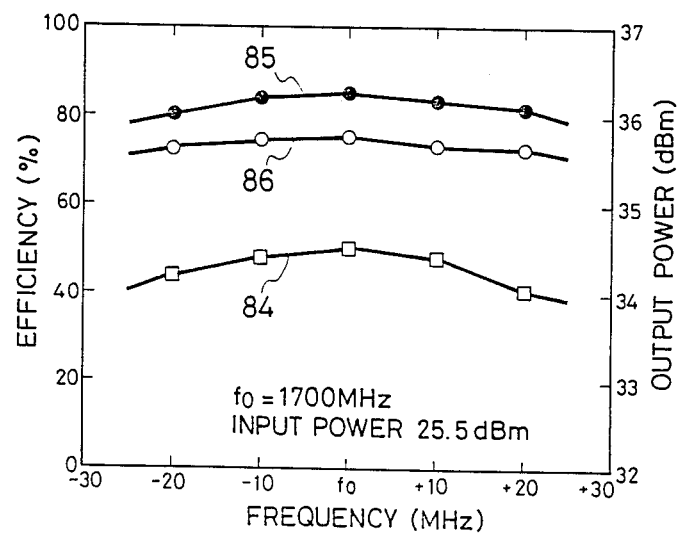
FIG. 15 is a graph showing frequency characteristics of the efficiency and output power of the power amplifier of the present invention.

The output power Po, the drain efficiency $\eta_d$, and the power added efficiency $\eta_{ad}$ vary with the deviation of the working frequency from the set center frequency as indicated by curves 84, 85 and 86 in FIG. 15, respectively. The power amplifier of the present invention can be utilized satisfactorily in mobile communications and the like over the band width shown in FIG. 15. The efficiency $\eta_d$ is about 75% at the highest in the prior art and 30 to 40% at the best in practice; therefore, it will be seen that the present invention achieves a high efficiency. As a result of this, the present invention can be expected to decrease the volume of the power amplifier around 30% and reduce its power consumption nearly 30% as compared with conventional power amplifiers. In addition, the present invention can offer power amplifiers of high efficiency unobtainable in the past, over a frequency range from the medium wave to microwave bands and for small to large outputs.

It will be apparent that many modifications and variations may be effected without departing from the scope of the novel concepts of the present invention.

What is claimed is:

1. A power amplifier comprising:
a divider for dividing an input signal into two signals;
first and second amplifying means connected to two outputs of the divider, respectively, for producing harmonics of the input signal;
filter means connected between the output sides of the first and second amplifying means, for rejecting the fundamental wave component of the input signal but passing therethrough at least a second order harmonic component of the input signal, said filter means including phase inversion means by which voltages flowing thereinto and flowing out therefrom, for the second order harmonic of the input signal, are rendered opposite in phase from each other at the output side of each of the first and second amplifying means;
first and second select circuits connected to the output sides of the first and second amplifying means, respectively, for passing therethrough the fundamental wave component of the input signal; and
a combiner for combining the outputs from the first and second select circuits in phase with each other.

2. A power amplifier comprising:
a divider for dividing an input signal into two signals;
first and second amplifying means connected to two outputs of said divider, respectively, each for producing harmonics of the input signal as well as a fundamental wave component thereof;
filter means connected between the output sides of said first and second amplifying means, for rejecting the fundamental wave component of said input signal while passing therethrough at least a second order harmonic component of said input signal so that at least the second order harmonic component produced at the output of either of said first and second amplifying means is fed into the output of the other of said first and second amplifying means to cancel at least the second order harmonic component produced by said other first and second amplifying means;
first and second select circuits connected to the output sides of said first and second amplifying means, respectively, for passing therethrough the fundamental component of said input signal; and
a combiner for combining the outputs from said first and second select circuits in phase with each other to produce an output of said power amplifier.

3. The power amplifier according to claim 2, which the filter means includes a phase shifter connected in series thereto for adjusting the second order harmonic component from the output of either one of the first and second amplifying means so that it becomes 180° out of phase with respect to the second order harmonic component coming into the said output from the other one of the amplifying means via the filter means.

4. The power amplifier according to claim 2, wherein each of the first and second select circuits is a band rejection filter for rejecting the second order harmonic component of the input signal.

5. The power amplifier according to claim 2, wherein each of the first and second select circuits is a low pass filter having a cutoff frequency between the fundamental frequency and the second order harmonic frequency of the input signal.

6. The power amplifier according to claim 2, wherein the combiner is composed of a 90° hybrid.

7. The power amplifier according to claim 2, wherein the first and second amplifying means are class "B" bias amplifying means.

8. The power amplifier according to claim 1 or claim 2, wherein the filter means also passes therethrough at least a third order harmonic component such that voltages flowing thereinto and flowing out therefrom, for the third order harmonic component of the input signal, are rendered in phase to each other at the output sides of the first and second amplifying means.

9. The power amplifier according to claim 1 or claim 2, wherein the filter means comprises a band pass filter which permits the passage therethrough of the second harmonic component of the input signal.

10. The power amplifier according to claim 9, wherein the band pass filter is a resonator which is resonant to the second harmonic component of the input signal.

11. The power amplifier according to claim 1 or claim 2, wherein the filter means comprises a band rejection filter which inhibits the passage therethrough of the fundamental frequency component of the input signal.

12. The power amplifier according to claim 1 or claim 2, wherein the filter means comprises a high pass filter which has a cutoff frequency intermediate between the fundamental frequency component and the second harmonic component of the input signal.

* * * * *